US008767407B2

(12) United States Patent
Lim et al.

(10) Patent No.: US 8,767,407 B2
(45) Date of Patent: Jul. 1, 2014

(54) MOBILE TERMINAL

(75) Inventors: Gukchan Lim, Seoul (KR); Hyokune Hwang, Gyeonggi-Do (KR); Hyunok Lee, Seoul (KR); Jungwoo Sohn, Incheon (KR); Jinsu Lee, Gyeonggi-Do (KR); Taejong Jeong, Seoul (KR); Dongsu Han, Seoul (KR); Yongheon He, Gyeonggi-Do (KR); Hongjo Shim, Seoul (KR)

(73) Assignee: LG Electronics Inc., Seoul (KR)

( * ) Notice: Subject to any disclaimer, the term of this patent is extended or adjusted under 35 U.S.C. 154(b) by 307 days.

(21) Appl. No.: 13/244,277

(22) Filed: Sep. 24, 2011

(65) Prior Publication Data

US 2012/0147573 A1  Jun. 14, 2012

(30) Foreign Application Priority Data

Dec. 10, 2010  (KR) .................. 10-2010-0126520

(51) Int. Cl.
*H05K 5/00* (2006.01)

(52) U.S. Cl.
USPC ........... 361/753; 361/737; 361/800; 361/816; 361/818; 174/359; 174/372; 174/387; 250/515.1

(58) Field of Classification Search
USPC .......... 361/753, 737, 800, 816, 818; 174/359, 174/372, 387; 250/515.1
See application file for complete search history.

(56) References Cited

U.S. PATENT DOCUMENTS

| 3,721,746 | A | * | 3/1973 | Knappenberger | 174/372 |
|-----------|---|---|--------|---------------|---------|
| 5,323,299 | A | * | 6/1994 | Weber | 361/818 |
| 5,335,147 | A | * | 8/1994 | Weber | 361/818 |
| 5,557,507 | A | * | 9/1996 | Koike et al. | 361/816 |
| 6,018,461 | A | * | 1/2000 | Biermann et al. | 361/737 |
| 6,362,793 | B1 | * | 3/2002 | Sawamura et al. | 343/702 |
| 6,462,958 | B2 | * | 10/2002 | Ogata | 361/800 |
| 6,624,432 | B1 | * | 9/2003 | Gabower et al. | 250/515.1 |
| 2003/0107881 | A1 | * | 6/2003 | Muramatsu et al. | 361/818 |
| 2006/0067070 | A1 | * | 3/2006 | Otsuki | 361/816 |

* cited by examiner

*Primary Examiner* — Xiaoliang Chen
(74) *Attorney, Agent, or Firm* — Lee, Hong, Degerman, Kang & Waimey

(57) ABSTRACT

A mobile terminal includes a main body; at least one circuit board placed in the main body and comprising an upper surface, a lower surface, and at least one lateral surface; at least one conductive body disposed at the at least one lateral surface of the at least one circuit board and electrically connected to a ground of the at least one circuit board; and at least one shield member mounted on the at least one circuit board. The at least one shield member includes a base portion formed to cover at least part of the upper surface or the lower surface of the at least one circuit board and at least one protrusion portion protruded from the base portion and formed to be electrically in contact with the at least one conductive body.

19 Claims, 8 Drawing Sheets

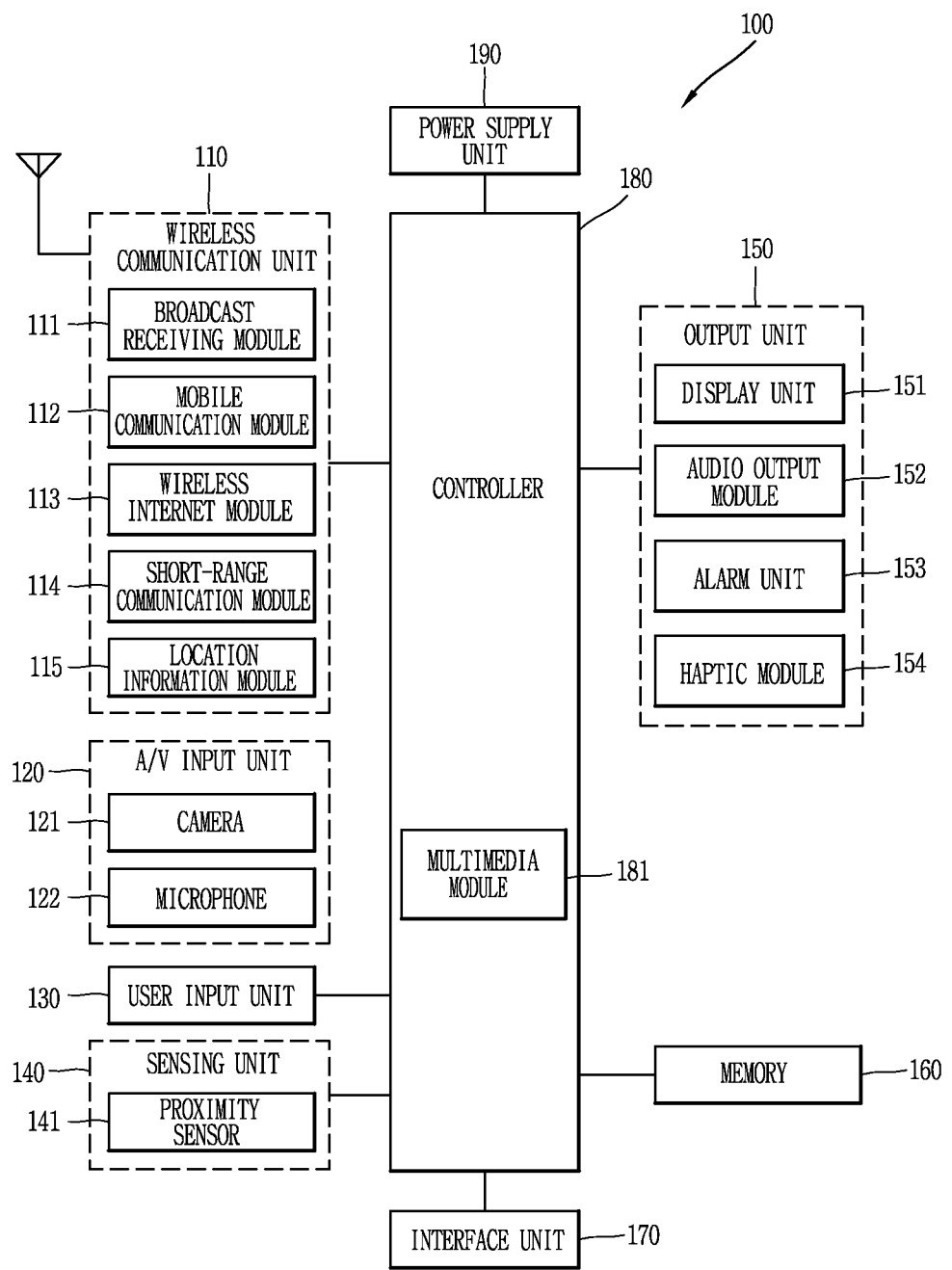

MOBILE TERMINAL

CROSS-REFERENCE TO RELATED APPLICATIONS

Pursuant to 35 U.S.C. §119(a), this application claims the benefit of earlier filing date and right of priority to Korean Application No. 10-2010-0126520, filed on Dec. 10, 2010, the contents of which are incorporated by reference herein in their entirety.

BACKGROUND OF THE INVENTION

1. Field of the Invention

The present disclosure relates to a mobile terminal in which a shield member is mounted on a circuit board thereof.

2. Description of the Related Art

Terminals can be classified into two types, such as a mobile/portable terminal and a stationary terminal based on its mobility. Furthermore, the mobile terminal can be further classified into two types, such as a handheld terminal and a vehicle mount terminal based on whether or not it can be directly carried by a user.

As the terminals become multifunctional, for example, such terminals are allowed to capture still images or moving images, play music or video files, play games, receive broadcast and the like, so as to be implemented as an integrated multimedia player.

For the functional support and enhancement of such a mobile terminal, it may be considered to improve the structural and/or software aspects of the mobile terminal. In particular, for one of the structural improvements of the terminal, a mechanism for combining a circuit board and a shield member within the terminal may be taken into consideration.

SUMMARY OF THE INVENTION

One aspect of the present invention is to provide a mechanism for combining a circuit board and a shield member capable of having a higher reliability and further enlarging the mounting area of the circuit board, and a mobile terminal having the same.

A mobile terminal according to an embodiment of the present invention includes a main body; at least one circuit board placed in the main body and comprising an upper surface, a lower surface, and at least one lateral surface; at least one conductive body disposed at the at least one lateral surface of the at least one circuit board and electrically connected to a ground of the at least one circuit board; and at least one shield member mounted on the at least one circuit board. The at least one shield member may include a base portion formed to cover at least part of the upper surface or the lower surface of the at least one circuit board and at least one protrusion portion protruded from the base portion and formed to be electrically in contact with the at least one conductive body.

A mobile terminal according to another embodiment of the present invention includes a main body; at least one circuit board placed in the main body and comprising an upper surface, a lower surface, and at least one lateral surface, the at least one circuit board formed by a plurality of layers including insulating layers and printed layers that are laminated; at least one conductive body disposed at the at least one lateral surface of the at least one circuit board and electrically connected to a ground of the at least one circuit board; and at least one shield member mounted on the at least one circuit board. The at least one shield member includes a base portion formed to cover at least part of the upper surface or the lower surface of the at least one circuit board; at least one protrusion portion protruded from the base portion and formed to be electrically in contact with the conductive body; and a fastening protrusion protruded from the base portion and inserted into a recess portion formed at the upper surface or the lower surface of the at least one circuit board, wherein the recess portion is formed to penetrate part of the plurality of layers of the at least one circuit board.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings:

FIG. 1 is a block diagram illustrating a mobile terminal associated with an embodiment of the present invention.

DETAILED DESCRIPTION OF THE INVENTION

Figure 2A:
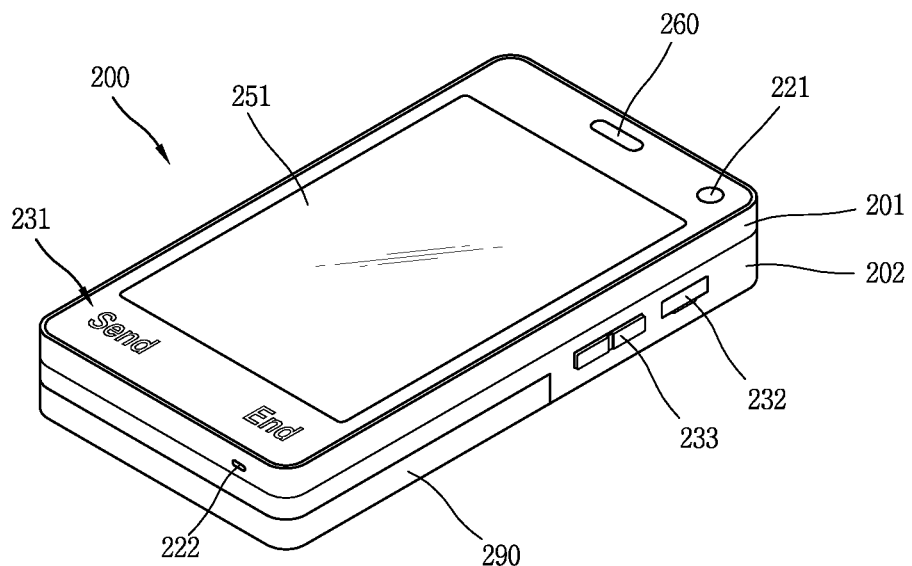
FIG. 2A is a front perspective view of a mobile terminal according to an embodiment of the present invention.

Hereinafter, a mobile terminal associated with the present invention will be described in more detail with reference to the accompanying drawings. This specification employs like/similar reference numerals for like/similar components irrespective of different embodiments, so they all will be understood by the first description. The expression in the singular form in this specification will cover the expression in the plural form unless otherwise indicated obviously from the context.

The suffixes "module" and "unit or portion" for components used in the following description are merely provided only for facilitation of preparing this specification, and thus, they are not granted a specific meaning or function.

A mobile terminal disclosed herein may include a portable phone, a smart phone, a laptop computer, a digital broadcast terminal, a personal digital assistant (PDA), a portable multimedia player (PMP), a navigation, and the like. However, it would be easily understood by those skilled in the art that a configuration according to the following description may be applicable to a stationary terminal such as a digital TV, a desktop computer, and the like, excluding constituent elements particularly configured for mobile purposes.

FIG. 1 is a block diagram illustrating a mobile terminal according to an embodiment of the present invention.

The mobile terminal 100 may include a wireless communication unit 110, an audio/video (A/V) input unit 120, a user input unit 130, a sensing unit 140, an output unit 150, a memory 160, an interface unit 170, a controller 180, a power supply unit 190, and the like. However, the constituent elements as illustrated in FIG. 1 are not necessarily required, and the mobile terminal may be implemented with greater or less number of elements than those illustrated elements.

Hereinafter, the constituent elements will be described in sequence.

The wireless communication unit 110 typically includes one or more elements allowing radio communication between the mobile terminal 100 and a wireless communication system, or allowing radio communication between the mobile terminal 100 and a network in which the mobile terminal 100 is located. For example, the wireless communication unit 110 may include a broadcast receiving module 111, a mobile communication module 112, a wireless Internet module 113, a short-range communication module 114, a location information module 115, and the like.

The broadcast receiving module 111 receives broadcast signals and/or broadcast associated information from an external broadcast management server through a broadcast channel. The broadcast channel may include a satellite channel and/or a terrestrial channel. The broadcast management server may mean a server that generates and transmits a broadcast signal and/or broadcast associated information or a server that receives a previously generated broadcast signal and/or broadcast associated information and transmits to the mobile terminal 100. The broadcast signal may include a TV broadcast signal, a radio broadcast signal and a data broadcast signal as well as a broadcast signal in a form that a data broadcast signal is coupled to the TV or radio broadcast signal.

The broadcast associated information may mean information regarding a broadcast channel, a broadcast program, a broadcast service provider, and the like. The broadcast associated information may also be provided through a mobile communication network, and in this case, the broadcast associated information may be received by the mobile communication module 112.

The broadcast associated information may exist in various forms. For example, it may exist in the form of an electronic program guide (EPG) of digital multimedia broadcasting (DMB), electronic service guide (ESG) of digital video broadcast-handheld (DVB-H), and the like.

The broadcast receiving module 111 may receive a broadcast signal using various types of broadcast systems. In particular, the broadcast receiving module 111 may receive a digital broadcast signal using a digital broadcast system such as digital multimedia broadcasting-terrestrial (DMB-T), digital multimedia broadcasting-satellite (DMB-S), media forward link only (MediaFLO), digital video broadcast-handheld (DVB-H), integrated services digital broadcast-terrestrial (ISDB-T), and the like. The broadcast receiving module 111 is, of course, configured to be suitable for every broadcast system that provides a broadcast signal as well as the above-mentioned digital broadcast systems. The broadcast signal and/or broadcast-associated information received through the broadcast receiving module 111 may be stored in the memory 160.

The mobile communication module 112 transmits and/or receives a radio signal to and/or from at least one of a base station, an external terminal and a server over a mobile communication network. Here, the radio signal may include a voice call signal, a video call signal and/or various types of data according to text and/or multimedia message transmission and/or reception.

The wireless Internet module 113 means a module for supporting wireless Internet access. The wireless Internet module 113 may be built-in or externally installed to the mobile terminal 100. Here, it may be used a wireless Internet access technique including a WLAN (Wireless LAN), Wi-Fi, Wibro (Wireless Broadband), Wimax (World Interoperability for Microwave Access), HSDPA (High Speed Downlink Packet Access), and the like.

The short-range communication module 114 is a module for supporting a short-range communication. Here, it may be used a short-range communication technology including Bluetooth®, Radio Frequency IDentification (RFID), Infrared Data Association (IrDA), Ultra WideBand (UWB), ZigBee®, and the like.

The location information module 115 is a module for checking or acquiring a location of the mobile terminal 100, and there is a Global Positioning System (GPS) module as a representative example.

Still referring to FIG. 1, the A/V (audio/video) input unit 120 receives an audio or video signal, and the A/V input unit 120 may include a camera 121 and a microphone 122. The camera 121 processes a image frame, such as still picture or video, obtained by an image sensor in a video phone call or image capturing mode. The processed image frame may be displayed on a display unit 151.

The image frames processed by the camera 121 may be stored in the memory 160 or transmitted to an external device through the wireless communication unit 110. Two or more cameras 121 may be provided according to the use environment of the mobile terminal 100.

The microphone 122 receives an external audio signal through a microphone in a phone call mode, a recording mode, a voice recognition mode, and the like, and processes the audio signal into electrical voice data. The processed voice data may be converted and outputted into a format that is transmittable to a mobile communication base station through the mobile communication module 112 in the phone call mode. The microphone 122 may implement various types of noise canceling algorithms to cancel noise generated in a procedure of receiving the external audio signal.

The user input unit 130 may generate input data to control an operation of the mobile terminal 100. The user input unit 130 may be configured by including a keypad, a dome switch, a touch pad (pressure/capacitance), a jog wheel, a jog switch, and the like.

The sensing unit 140 detects a current status of the mobile terminal 100 such as an opened or closed state of the mobile terminal 100, a location of the mobile terminal 100, an orientation of the mobile terminal 100, and the like, and generates a sensing signal for controlling the operation of the mobile terminal 100. For example, when the mobile terminal 100 is a slide phone type, it may sense an opened or closed state of the slide phone. Furthermore, the sensing unit 140 takes charge of a sensing function associated with whether or not power is supplied from the power supply unit 190, or whether or not an external device is coupled to the interface unit 170. On the other hand, the sensing unit 140 may include a proximity sensor 141.

The output unit 150 is configured to provide an output for audio signal, video signal, or alarm signal, and the output unit 150 may include the display unit 151, an audio output module 152, an alarm unit 153, a haptic module 154, and the like.

The display unit 151 may display (output) information processed in the mobile terminal 100. For example, when the mobile terminal 100 is in a phone call mode, the display unit 151 may display a User Interface (UI) or a Graphic User Interface (GUI) associated with a call. When the mobile terminal 100 is in a video call mode or image capturing mode, the display unit 151 may display a captured image and/or received image, a UI or GUI.

The display unit 151 may include at least one of a Liquid Crystal Display (LCD), a Thin Film Transistor-LCD (TFT-LCD), an Organic Light Emitting Diode (OLED) display, a flexible display, or a three-dimensional (3D) display.

Some of those displays may be configured with a transparent or optical transparent type to allow viewing of the exterior through the display unit, which may be called transparent displays. An example of the typical transparent displays may include a transparent LCD (TOLED), and the like. Under this configuration, a user can view an object positioned at a rear side of a terminal body through a region occupied by the display unit 151 of the terminal body.

The display unit 151 may be implemented in two or more in number according to a configured aspect of the mobile terminal 100. For instance, a plurality of the display units 151 may be arranged on one surface to be spaced apart from or integrated with each other, or may be arranged on different surfaces.

Here, if the display unit 151 and a touch sensitive sensor (referred to as a touch sensor) have an interlayer structure, the structure may be referred to as a touch screen. The display unit 151 may be used as an input device rather than an output device. The touch sensor may be implemented as a touch film, a touch sheet, a touch pad, and the like.

The touch sensor may be configured to convert changes of a pressure applied to a specific part of the display unit 151, or a capacitance occurring from a specific part of the display unit 151, into electric input signals. Also, the touch sensor may be configured to sense not only a touched position and a touched area, but also a touch pressure.

When touch inputs are sensed by the touch sensors, corresponding signals are transmitted to a touch controller (not shown). The touch controller processes the received signals, and then transmits corresponding data to the controller 180. Accordingly, the controller 180 may sense which region of the display unit 151 has been touched.

Still referring to FIG. 1, a proximity sensor 141 may be arranged at an inner region of the mobile terminal 100 covered by the touch screen, or near the touch screen. The proximity sensor 141 senses presence or absence of an object approaching to a surface to be sensed, or an object disposed near a surface to be sensed, by using an electromagnetic field or infrared rays without a mechanical contact. The proximity sensor 141 has a longer lifespan and a more enhanced utility than a contact sensor.

The proximity sensor 141 may include an optical transmission type photoelectric sensor, a direct reflective type photoelectric sensor, a mirror reflective type photoelectric sensor, a high-frequency oscillation proximity sensor, a capacitance type proximity sensor, a magnetic type proximity sensor, an infrared rays proximity sensor, and so on. When the touch screen is implemented as a capacitance type, proximity of a pointer to the touch screen is sensed by changes of an electromagnetic field. In this case, the touch screen (touch sensor) may be categorized into a proximity sensor 141.

Hereinafter, for the sake of convenience of brief explanation, a status that the pointer is positioned to be proximate onto the touch screen without contact will sometimes be referred to as 'proximity touch', whereas a status that the pointer substantially comes in contact with the touch screen will sometimes be referred to as 'contact touch'. For the position corresponding to the proximity touch of the pointer on the touch screen, such position corresponds to a position where the pointer faces perpendicular to the touch screen upon the proximity touch of the pointer.

The proximity sensor 141 senses proximity touch, and proximity touch patterns (e.g., distance, direction, speed, time, position, moving status, etc.). Information relating to the sensed proximity touch and the sensed proximity touch patterns may be output onto the touch screen.

The audio output module 152 may output audio data received from the wireless communication unit 110 or stored in the memory 160, in a call-receiving mode, a call-placing mode, a recording mode, a voice recognition mode, a broadcast reception mode, and so on. The audio output module 152 may output audio signals relating to functions performed in the mobile terminal 100, e.g., sound alarming a call received or a message received, and so on. The audio output module 152 may include a receiver, a speaker, a buzzer, and so on.

The alarm unit 153 outputs signals notifying occurrence of events from the mobile terminal 100. The events occurring from the mobile terminal 100 may include call received, message received, key signal input, touch input, and so on. The alarm unit 153 may output not only video or audio signals, but also other types of signals such as signals notifying occurrence of events in a vibration manner. Since the video or audio signals can be output through the display unit 151 or the audio output unit 152, the display unit 151 and the audio output module 152 may be categorized into a part of the alarm unit 153.

The haptic module 154 generates various tactile effects which a user can feel. A representative example of the tactile effects generated by the haptic module 154 includes vibration. Vibration generated by the haptic module 154 may have a controllable intensity, a controllable pattern, and so on. For instance, different vibration may be output in a synthesized manner or in a sequential manner.

The haptic module 154 may generate various tactile effects, including not only vibration, but also arrangement of pins vertically moving with respect to a skin being touched, air injection force or air suction force through an injection hole or a suction hole, touch by a skin surface, presence or absence of contact with an electrode, effects by stimulus such as an electrostatic force, reproduction of cold or hot feeling using a heat absorbing device or a heat emitting device, and the like.

The haptic module 154 may be configured to transmit tactile effects through a user's direct contact, or a user's muscular sense using a finger or a hand. The haptic module 154 may be implemented in two or more in number according to the configuration of the mobile terminal 100.

The memory 160 may store a program for processing and controlling the controller 180. Alternatively, the memory 160 may temporarily store input/output data (e.g., phonebook data, messages, audios, still images, videos, and the like). Also, the memory 160 may store data related to various patterns of vibrations and sounds outputted upon the touch input on the touch screen.

The memory 160 may be implemented using any type of suitable storage medium including a flash memory type, a hard disk type, a multimedia card micro type, a memory card type (e.g., SD or DX memory), Random Access Memory (RAM), Static Random Access Memory (SRAM), Read-Only Memory (ROM), Electrically Erasable Programmable Read-only Memory (EEPROM), Programmable Read-only Memory (PROM), magnetic memory, magnetic disk, optical disk, and the like. Also, the mobile terminal 100 may operate a web storage which performs the storage function of the memory 160 on the Internet.

The interface unit 170 may generally be implemented to interface the mobile terminal 100 with external devices. The interface unit 170 may allow a data reception from an external device, a power delivery to each component in the mobile terminal 100, or a data transmission from the mobile terminal 100 to an external device. The interface unit 170 may include, for example, wired/wireless headset ports, external charger ports, wired/wireless data ports, memory card ports, ports for coupling devices having an identification module, audio Input/Output (I/O) ports, video I/O ports, earphone ports, and the like.

The identification module may be configured as a chip for storing various information required to authenticate an authority to use the portable terminal 100, which may include a User Identity Module (UIM), a Subscriber Identity Module (SIM), and the like. Also, the device having the identification module (hereinafter, referred to as 'identification device') may be implemented in a type of smart card. Hence, the identification device can be coupled to the mobile terminal 100 via a port.

Also, the interface unit may serve as a path for power to be supplied from an external cradle to the mobile terminal 100 when the mobile terminal 100 is connected to the external cradle or as a path for transferring various command signals inputted from the cradle by a user to the mobile terminal 100. Such various command signals or power inputted from the cradle may operate as signals for recognizing that the mobile terminal 100 has accurately been mounted to the cradle.

The controller 180 typically controls the overall operations of the mobile terminal 100. For example, the controller 180 performs the control and processing associated with telephony calls, data communications, video calls, and the like. The controller 180 may include a multimedia module 181 which provides multimedia playback. The multimedia module 181 may be configured as part of the controller 180 or as a separate component.

The controller 180 can perform a pattern recognition processing so as to recognize writing or drawing input on the touch screen as text or image.

The power supply unit 190 provides power required by various components under the control of the controller 180.

Various embodiments described herein may be implemented in a computer-readable medium using software, hardware, or any combination thereof.

For hardware implementation, it may be implemented by using at least one of application specific integrated circuits (ASICs), digital signal processors (DSPs), digital signal processing devices (DSPDs), programmable logic devices (PLDs), field programmable gate arrays (FPGAs), processors, controllers, micro-controllers, microprocessors, electrical units designed to perform the functions described herein. In some cases, such embodiments may be implemented in the controller 180 itself.

For software implementation, the embodiments such as procedures or functions may be implemented together with separate software modules that allow performing of at least one function or operation. Software codes can be implemented by a software application written in any suitable programming language. The software codes may be stored in the memory 160 and executed by the controller 180.

Figure 2B:
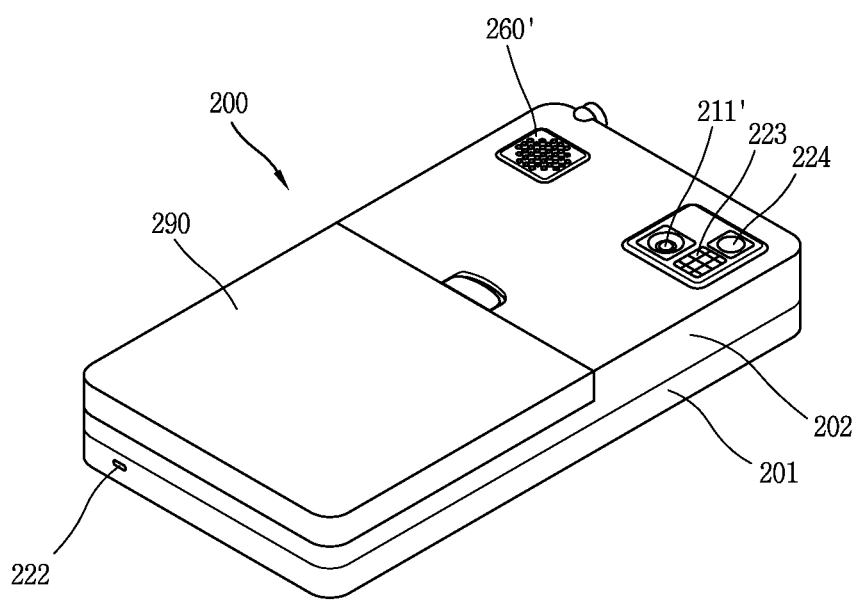
FIG. 2B is a rear perspective view of a mobile terminal according to an embodiment of the present invention.

FIG. 2A is a front perspective view of a mobile terminal according to an embodiment of the present invention, and FIG. 2B is a rear perspective view of a mobile terminal according to an embodiment of the present invention.

The mobile terminal 200 disclosed herein is provided with a bar-type terminal body. However, the present invention is not only limited to this type of terminal, but is also applicable to various structures of terminals such as slide type, folder type, swivel type, swing type, and the like, in which two and more bodies are combined with each other in a relatively movable manner.

The terminal body includes a case (casing, housing, cover, etc.) forming an appearance of the terminal. In this embodiment, the case may be divided into a front case 201 and a rear case 202. Various electronic components may be incorporated in a space formed between the front case 201 and the rear case 202. At least one middle case may be additionally disposed between the front case 101 and the rear case 102.

The cases may be formed by injection-molding a synthetic resin or may be also formed of a metal material such as stainless steel (STS), titanium (Ti), or the like.

A display unit 251, an audio output module 260, a camera 221, a user input unit (231, 232, 233), and the like may be arranged on the terminal body, mainly on the front case 201.

The display unit 251 occupies a most portion of the front case 201. The audio output module 260 and the camera 221 are disposed on a region adjacent to one of both ends of the display unit 251.

Various kinds of visual information may be displayed on the display unit 251. The visual information may be displayed in a form of characters, numerals, symbols, graphics, or icons.

For an input of the visual information, at least one of the characters, numerals, symbols, graphics, or icons may be displayed with a predetermined arrangement so as to be implemented in a form of keypad. Such a keypad may be referred to as a so-called "soft key."

The display unit 251 may be operated as an overall region, or may be divided into a plurality of regions to be operated. In case of the latter, the plurality of regions may be configured to be operated in an associative manner with one another.

The user input unit is manipulated to receive a command for controlling the operation of the mobile terminal 200, and may include a plurality of manipulation units 231, 232, 233. The manipulation units 231, 232, 233 may be commonly designated as a manipulating portion, and any method may be employed if it is a tactile manner allowing the user to perform manipulation with a tactile feeling.

The content inputted by the manipulation units 231, 232, 233 may be set in various ways. For example, the first manipulation unit 231 may be used to receive a command, such as start, end, scroll, or the like, and may be disposed at a region adjacent to an end portion, which is different from the end portion disposed with the audio output module 260, at both end portions of the display unit 251.

The second and the third manipulation unit 232, 233 may be formed to receive a command, such as controlling a volume level being outputted from the audio output module 260, or switching into a touch recognition mode of the display unit 251.

A wired/wireless headset port 271 and a wired/wireless data port 272 may be disposed at a lower surface of the mobile terminal 200 (not shown in the drawing). The ports 271, 272 may be configured as an example of the interface 170 (refer to FIG. 1).

Referring to FIG. 2B, a camera 221' may be additionally mounted on a rear surface of the terminal body, namely, the rear case 202. The camera 221' has an image capturing direction, which is substantially opposite to the direction of the camera 221 (refer to FIG. 2A), and may have different pixels from those of the first camera 221.

For example, it is preferable that the camera 221 has a relatively small number of pixels enough not to cause a difficulty when the user captures his or her own face and sends it to the other party during a video call or the like, and the camera 221' has a relatively large number of pixels since the user often captures a general object that is not sent immediately. The cameras 221, 221' may be provided in the terminal body in a rotatable and popupable manner.

Furthermore, a flash 223 and a mirror 224 may be additionally disposed adjacent to the camera 221'. The flash 223 illuminates light toward an object when capturing the object with the camera 221'. The mirror 224 allows the user to look at his or her own face, or the like, in a reflected way when capturing himself or herself (in a self-portrait mode) by using the camera 221'.

Furthermore, an audio output module 260' may be additionally disposed on a rear surface of the terminal body. The audio output module 260' together with the audio output module 260 (refer to FIG. 2A) can implement a stereo function, and it may be also used to implement a speaker phone mode during a phone call.

Furthermore, an antenna for receiving broadcast signals may be additionally disposed on a lateral surface of the terminal body. The antenna constituting a broadcast receiving module 111 (refer to FIG. 1) may be provided so as to be pulled out from the terminal body.

Referring to the drawing, a microphone 222 may be provided on the terminal body. The microphone 222 may be disposed at a region adjacent to an end portion, which is different from the end portion disposed with the audio output module 260, on the display unit 251.

A user input unit 232 and a connection port (not shown in the drawing) may be disposed at the lower surfaces of the front case 201 and rear case 202.

The connection port is provided to receive data from an external device, and receive power and transfer it to each constituent element within the mobile terminal 200, and transfer data within the mobile terminal 200 to an external device. The connection port may be configured as an example of the interface 170 (refer to FIG. 1).

Furthermore, a power supply unit 290 for supplying power to the mobile terminal 200 may be mounted on the terminal body. The power supply unit 290 may be configured so as to be incorporated in the terminal body, or directly detachable from the outside of the terminal body.

Each component in the terminal as described above may be controlled by a circuit board. Furthermore, a shield member may be mounted on the circuit board to protect the electronic elements mounted on the circuit board from electromagnetic waves. Hereinafter, a mechanism for combining a circuit board and a shield member will be described in more detail.

Figure 3:
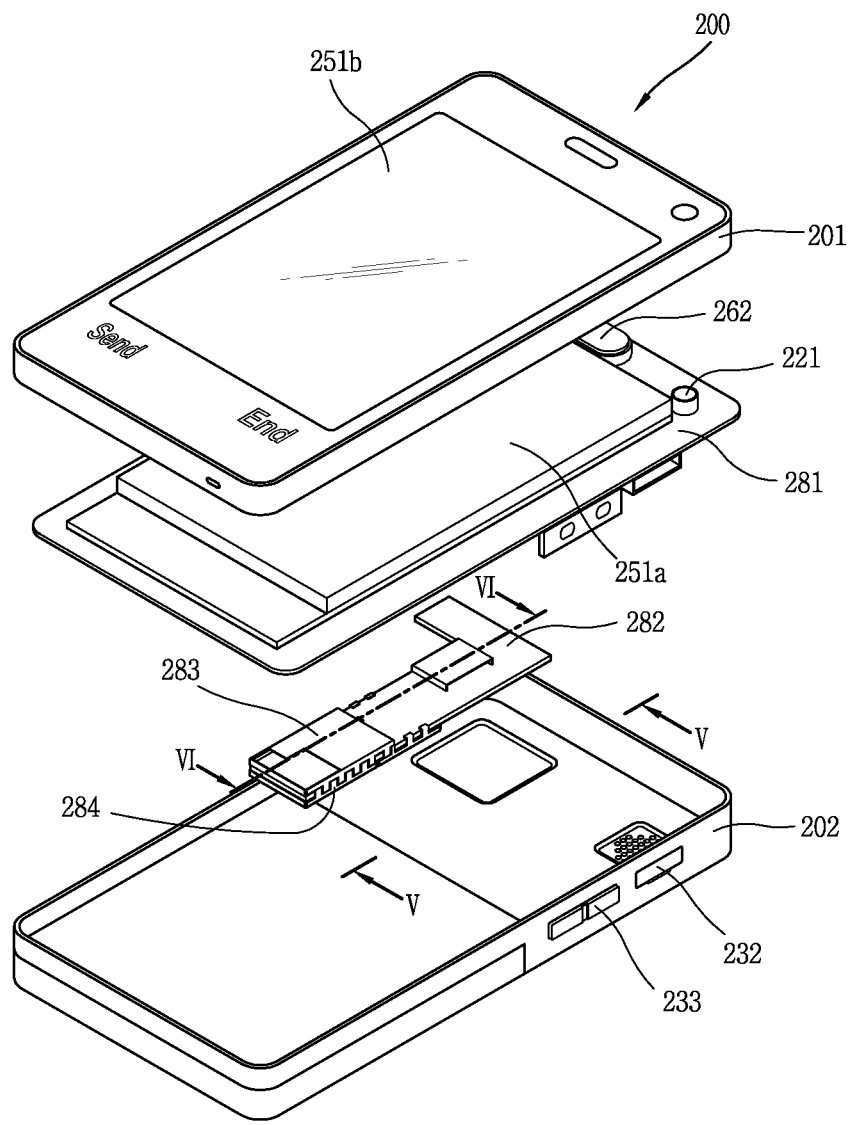
FIG. 3 is a front exploded view of a mobile terminal according to an embodiment of the present invention.

FIG. 3 is a front exploded view of a mobile terminal according to an embodiment of the present invention, for example, the mobile terminal shown in FIG. 2A.

Referring to FIG. 3, a window 251b is combined with one surface of the front case 201. The window 251b may be configured with a material such as an optical transmissive synthetic resin or tempered glass. However, the window 251b may include an optically non-transmissive portion. The optically non-transmissive portion may be implemented by separately covering the window with a pattern film as illustrated in the drawing. The pattern film may be formed so as to be transparent at the central portion thereof and non-transparent at the edge portion.

A display 251a may be mounted at a rear surface of the window 251b. An optical transmissive portion of the window 251b may have an area corresponding to the display 251a. Through this, the user may recognize visual information displayed on the display 251a from the outside.

A first and a second circuit board 281, 282 may be mounted on the rear case 202. The first and the second circuit board 281, 282 may be configured as an example of the controller 180 (refer to FIG. 1) for operating various functions of the mobile terminal 200. In this embodiment, it is illustrated that a plurality of circuit boards are provided in the mobile terminal 200, but the present invention may not be limited to this. In other words, the mobile terminal 200 may be provided with only one circuit board.

As illustrated in the drawing, the display 251a, an audio output element 262, and the camera 221, and the like may be mounted on the first circuit board 281. For example, the audio output element 262 may be a speaker, receiver, and the like.

The second circuit board 282 may be electrically connected to the first circuit board 281 to operate various functions of the mobile terminal 200 together with the first circuit board 281, and may be formed to have an upper surface, a lower surface, and a lateral surface thereof. Furthermore, the second circuit board 282 may be formed to be long along one direction (a length direction of the mobile terminal 200).

According to the drawing, shield members 283, 284 may be mounted on the second circuit board 282. The shield members 283, 284 are electrically connected to a ground of the second circuit board 282 to shield electronic elements mounted on the second circuit board 282 against electromagnetic waves.

Hereinafter, the combination relation between the second circuit board 282 and the shield members 283, 284 and the connection relation between the shield members 283, 284 and the ground will be described in more detail with respect to FIGS. 4 through 6.

Figure 4:
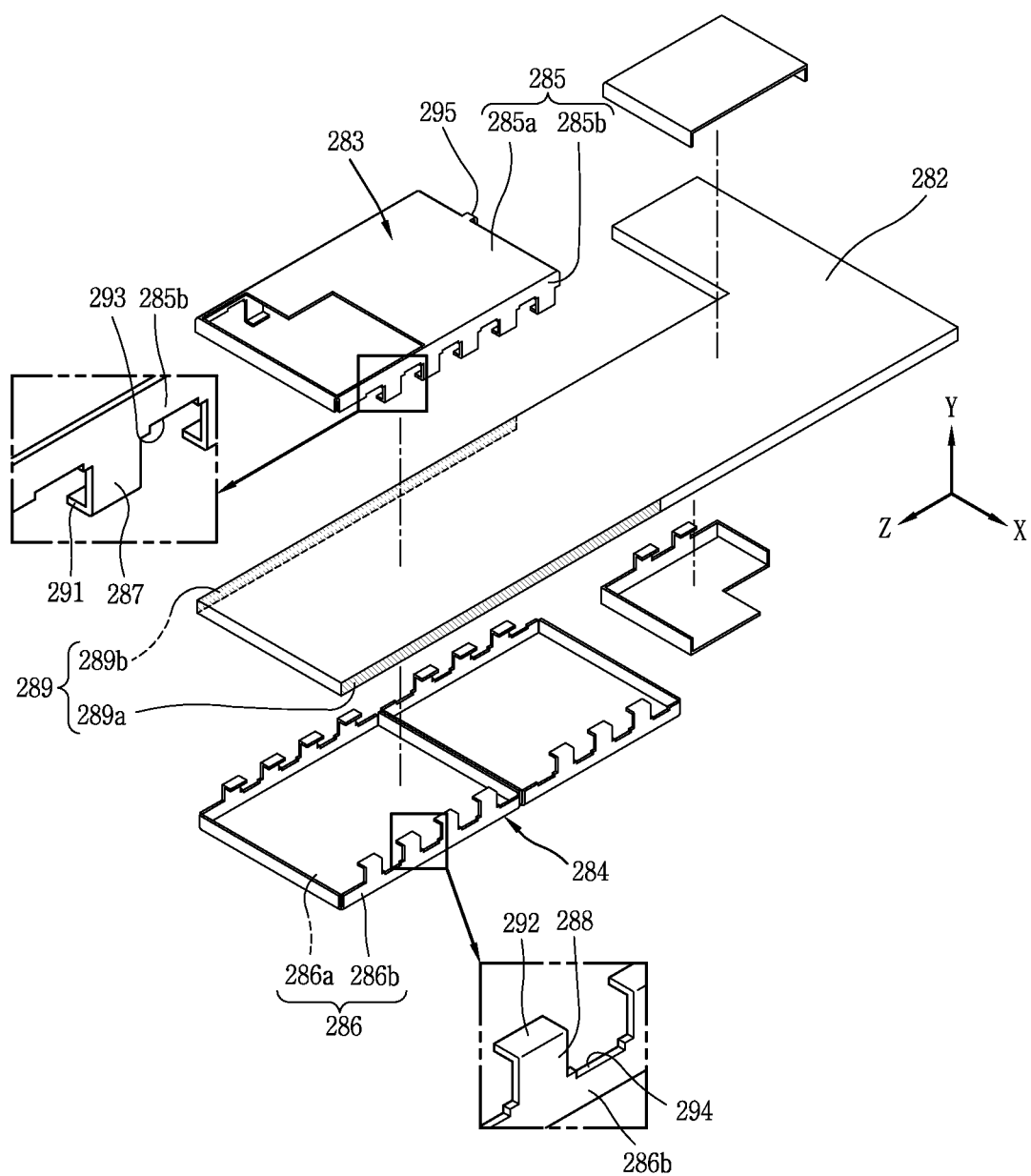
FIG. 4 is an exploded view of a circuit board and a shield member shown in FIG. 3.
Figure 5:
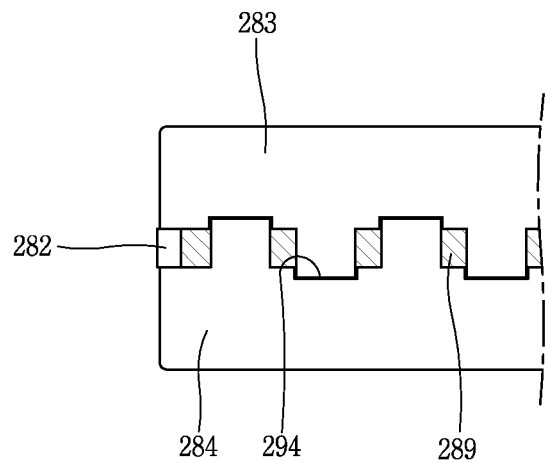
FIG. 5 is a side view of the circuit board and shield member viewed from the line V-V of FIG. 3.
Figure 6:
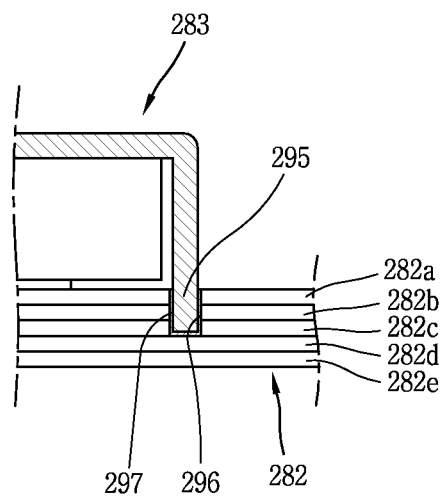
FIG. 6 is a cross-sectional view of the circuit board and shield member viewed from the line VI-VI of FIG. 3.

FIG. 4 is an exploded view of the circuit board 282 and the shield members 283, 284 shown in FIG. 3, and FIG. 5 is a side view of the circuit board 282 and the shield members 283, 284 viewed from the line V-V of FIG. 3, and FIG. 6 is a cross-sectional view of the circuit board 282 and the shield member 283, 284 viewed from the line VI-VI of FIG. 3.

Referring to the drawings, the shield members 283, 284 may include a first shield member 283 disposed at an upper surface of the second circuit board 282, and a second shield member 284 disposed at a lower surface of the second circuit board 282.

The first and the second shield members 283, 284 may have a first and a second base portions 285, 286, respectively. The first and the second base portions 285, 286 may be formed to cover at least part of the upper surface or lower surface of the second circuit board 282.

More specifically, the first base portion 285 may include a first base surface 285a and a first protruded wing 285b, and the second base portion 286 may include a second base surface 286a and a second protruded wing 286b.

The base surfaces 285a, 286a are formed in parallel to the upper surface or lower surface of the second circuit board 282, constituting a main surface for shielding electromagnetic waves.

The first and the second protruded wings 285b, 286b are bent at the base surfaces 285a, 286a, respectively, to shield a gap formed between the base surfaces 285a, 286a and the second circuit board 282. In other words, the first and the second protruded wings 285b, 286b are extended in a direction perpendicular to the base surfaces 285a, 286a from the base surfaces 285a, 286a with a length corresponding to that between the base surfaces 285a, 286a and a main surface (upper surface or lower surface) of the second circuit board 282.

The protruded wings 285b, 286b, for example, may be extended along a side of the base surfaces 285a, 286a, forming a closed loop according to circumstances. According to the structure, the base surfaces 285a, 286a perform the role of shielding in the Y-direction, and the protruded wings 285b, 286b perform the role of shielding in the X-direction.

Referring to FIGS. 4 and 5, protrusion portions 287, 288 are protruded from the base portions 285, 286. More specifically, the first and the second shield member 283, 284 have a first and a second protrusion portions 287, 288, respectively. The first and second protrusion portions 287, 288 are protruded from an end portion of the protruded wings 285b, 286b, respectively, and sequentially disposed with each other along a lateral surface of the second circuit board 282. Through this, the first and second protrusion portions 287, 288 cover a lateral surface of the second circuit board 282 in a zigzag manner.

According to the drawing, a conductive body 289 is disposed at a lateral surface of the second circuit board 282, and the conductive body 289 is electrically connected to a ground (not shown) of the second circuit board 282. However, this embodiment will not be limited to this, and the conductive body 289 may also be electrically connected to a ground (not shown) of the first circuit board 281 by electrical wiring.

The conductive body 289, for example, may be formed on a lateral surface of the second circuit board 282 with a liquid or gel-type material and then hardened into a solid phase. The lateral surface of the second circuit board 282 may be treated by grinding, cutting, or the like to enhance the contact reliability of the ground of the second circuit board 282. Furthermore, the lateral surface of the second circuit board 282 may be treated to expose a solder resist pattern of the second circuit board 282 to the outside.

The first and second protrusion portions 287, 288 are formed to be electrically connected to the conductive body 289. More specifically, the conductive body 289 and the first and second protrusion portions 287, 288 are formed to be brought into contact with each other.

For example, a plurality of first protrusion portions 287 are formed and disposed at a predetermined interval along a length direction of the second circuit board 282. Furthermore, a plurality of second protrusion portions 288 are formed and disposed at a predetermined interval along a length direction of the second circuit board 282. The conductive body 289 is formed at a lateral surface of the second circuit board 282 along the length direction thereof, and the first and the second protrusion portion 287, 288 are sequentially brought into contact with the conductive body 289.

According to the drawing, the conductive body 289a, 289b may be disposed at both lateral surfaces of the second circuit board 282, and the first and second protrusion portions 287, 288 may be, in a corresponding manner to this, formed at both lateral surfaces of the base surfaces 285, 286. Through this, an electrical connection between the first and second shield members 283, 284 may be accomplished in a highly reliable manner.

Referring to FIGS. 4 and 5, the shield members 283, 284 may include hook portions 291, 292 bent at an end portion of the protrusion portions 287, 288 to be hooked to an edge of the second circuit board 282. More specifically, the first and second hook portions 291, 292 are formed in a hook shape so as to be hooked to both surfaces of the second circuit board 282.

Though not shown in the drawing, the edge of the second circuit board 282 may be formed such that a printed layer is exposed to the outside, and the exposed portion is electrically connected to the ground. Through this, the hook portions 291, 292 may be electrically connected to the ground of the second circuit board 282 in addition to a connection path through the conductive body.

According to the drawing, recess portions 293, 294 recessed toward the base surfaces 285a, 286a are formed at an end portion of the protruded wings 285b, 286b to allow a second hook portion 292 and a first hook portion 291 to be penetrated, respectively. In other words, the first recess portion 293 is formed at the first protruded wing 285b of the first shield member 283 to allow the second hook portion 292 of the second shield member 284 to be penetrated, and the second recess portion 294 is formed at the second protruded wing 286b of the second shield member 284 to allow the first hook portion 291 of the first shield member 283 to be penetrated.

Referring to FIGS. 4 and 6, at least one of the first shield member 283 and the second shield member 284 may include a fastening protrusion 295 protruded from the base portions 285, 286. Furthermore, a recess portion 296 is formed at an upper surface or lower surface of the circuit board to allow the fastening protrusion 295 to be inserted. The Z-directional movement of the first and second shield members 283, 284 may be restricted according to the mutual relation of the fastening protrusion 295 and the recess portion 296. Hereinafter, a case where the fastening protrusion 295 is provided in the first shield member 283 and the recess portion 296 is formed at an upper surface of the second circuit board 282 will be described as an example.

The second circuit board 282 is formed to be laminated with a plurality of layers 282a, 282b, 282c, 282d, 282e, and the recess portion 296 is formed to penetrate part of the plurality of layers 282a, 282b, 282c, 282d, 282e. More specifically, the plurality of layers 282a, 282b, 282c, 282d, 282e may include insulating layers 282a, 282c, 282e and printed layers 282b, 282d sequentially laminated to each other and either one of the printed layers 282b, 282d is disposed at the bottom of the recess portion 296.

The connecting body 297 having a conductive material is formed on the recess portion 296, and the connecting body 297 is electrically connected to the ground of the second circuit board 282. In this case, any one of the plurality of layers 282a, 282b, 282c, 282d, 282e of the second circuit board 282 may form the ground.

The recess portion 296 may be formed by laser cutting, or the like, but may be also formed by vacating a portion corresponding to the recess portion 296 at the time of manufacturing the circuit board. With this method, the production of the circuit board may be further facilitated and the unit cost may be reduced.

According to the drawing, the fastening protrusion 295 may be disposed in a direction perpendicular to the first protrusion portion 287, and engaged with the recess portion 296. Through this, the Z-directional movement of the first shield member 283 may be restricted.

Furthermore, the fastening protrusion 295 may be formed only at either one of the first and second shield members 283, 284. As illustrated in this example, the Z-directional movement of the second shield member 284 may be restricted even when the fastening protrusion 295 is formed only at the first shield member 283. More specifically, the first and second shield members 283, 284 have the first and second protrusion portions 287, 288, respectively, and the first and second protrusion portions 287, 288 are sequentially disposed with one another along a lateral surface of the circuit board, and thus, the first and second protrusion portions 287, 288 restrict each other in the Z-direction. Accordingly, with only one fastening protrusion 295, both the first and second shield members 283, 284 may be fixed thereto.

Figure 7:
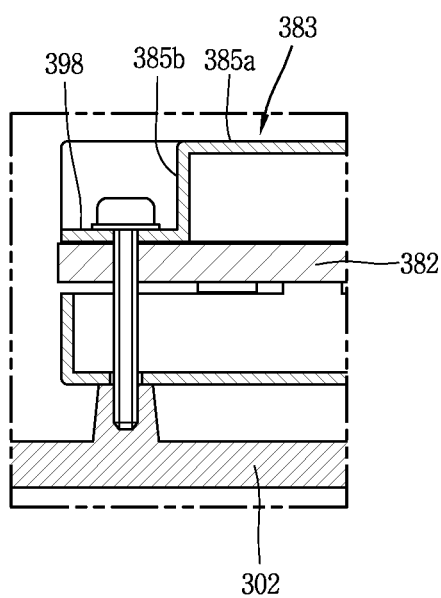
FIG. 7 illustrates a circuit board and a shield member according to an embodiment of the present invention.

FIG. 7 illustrates a modified example of the circuit board and shield member associated with the present invention.

Hereinafter, the description of a configuration same or similar to the foregoing embodiment as illustrated in FIGS. 4 through 6 will be replaced by the first description.

A shield member 383 may include a bending portion 398 bent in a direction parallel to a base surface 385a from a protruded wing 385b. A fastening hole is formed at the bending portion 398 to fasten a circuit board 382 to the terminal main body. For example, the circuit board 382 and the shield member 383 may be fixed through a screw, or the like, by penetrating the fastening hole to be fastened to the terminal case 302.

At this time, a printed layer is stripped off at the circumference of the fastening hole, and the stripped-off portion is connected to the ground, and a screw head thereof may be placed on this portion. Furthermore, a conductive material may be formed at a boundary surface of the fastening hole and the conductive material may be connected to the ground.

In this drawing, it is illustrated that the bending portion 398 is provided separately from a fastening protrusion 295 (refer to FIG. 6 or FIG. 6), but it may be also possible to have an embodiment provided only with the bending portion 398.

Figure 8:
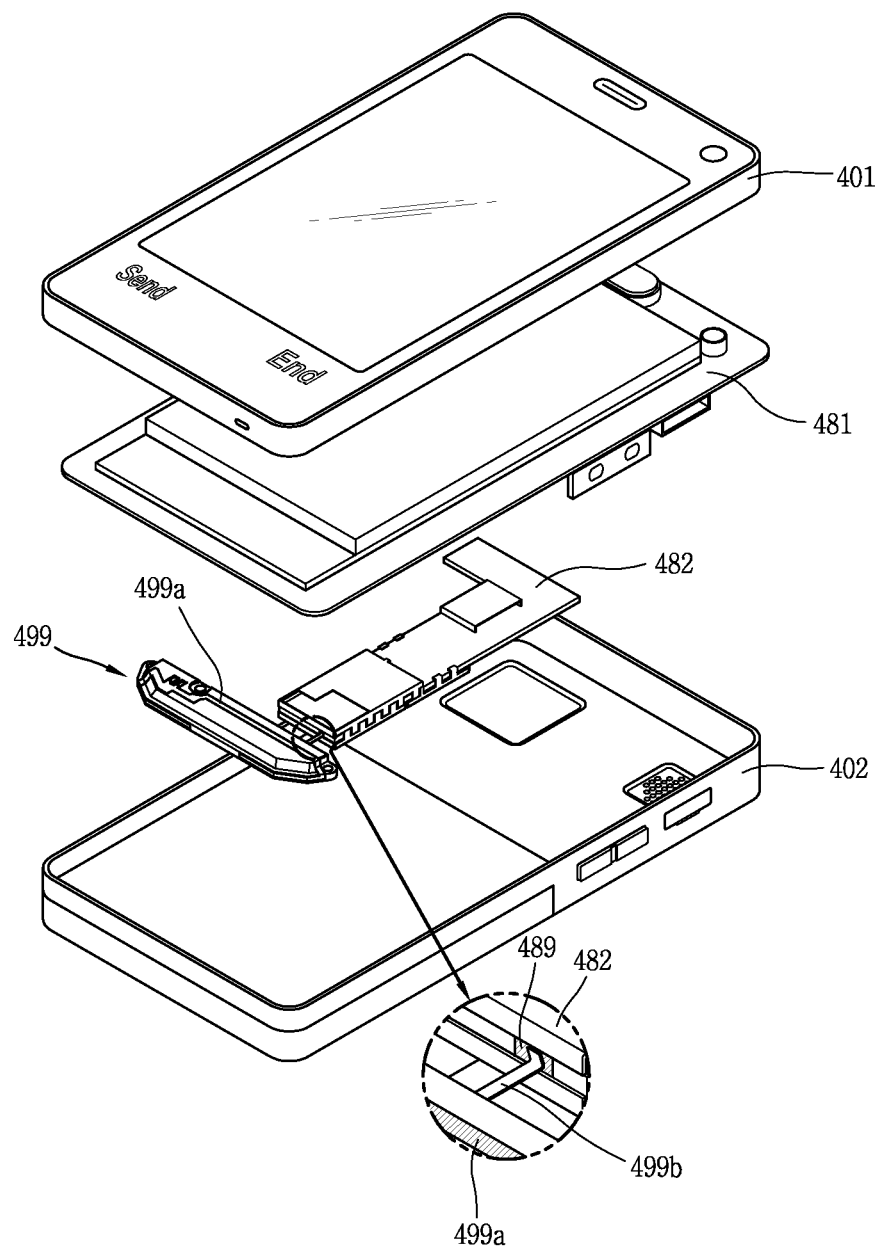
FIG. 8 is an exploded view of a mobile terminal according to another embodiment of the present invention.

FIG. 8 is an exploded view of a mobile terminal according to another embodiment of the present invention.

According to the drawing, an antenna portion 499 for transmitting and receiving radio signals is mounted on a rear case 402 of the terminal. The antenna portion 499 may have a structure in which an antenna pattern 499a is formed on a carrier, and an earth connecting portion 499b extended from the antenna pattern 499a toward a lateral surface of the circuit board 482 to be brought into contact with the conductive body 489 of the circuit board 482 may be formed on the antenna portion 499.

The earth connecting portion 499b may be formed in an elastically deformed manner, and may be a C-clip pogo pin, for example. The earth connecting portion 499b is electrically connected to the ground through a lateral surface of the circuit board 482, thereby realizing a terminal having a lower thickness.

Figure 9:
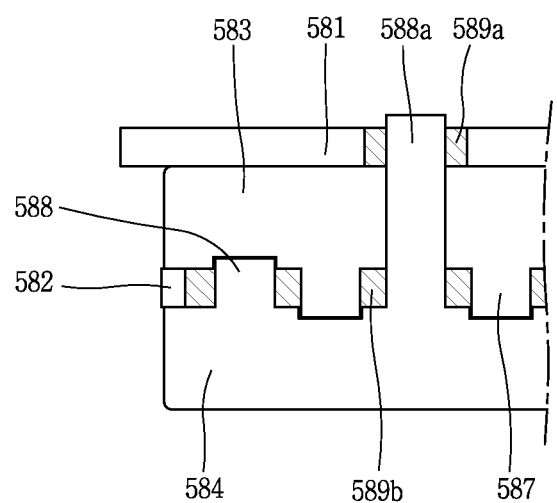
FIG. 9 is an exploded view of a mobile terminal according to still another embodiment of the present invention.

FIG. 9 is an exploded view of a mobile terminal according to still another embodiment of the present invention.

According to the drawing, the circuit boards 581, 582 may include a first circuit board 581 and a second circuit board 582 on which a first conductive body 589a and a second conductive body 589b are disposed at a lateral surface thereof, respectively. The first and second conductive bodies 589a, 589b are electrically connected to a ground of the first and second circuit boards 581, 582, respectively.

A first shield member 583 and a second shield member 584 are mounted on the second circuit board 582. However, this embodiment is not limited to this, and may have a structure in which the first shield member 583 is mounted on the first circuit board 581.

An auxiliary protrusion portion 588a protruded toward the first circuit board 581 to be electrically connected to the first conductive body 589a is formed at the first shield member 583 or second shield member 584. For example, an auxiliary protrusion portion 587a is protruded in a direction opposite to the first protrusion portion 587, and brought into contact with a lateral surface of the first circuit board 581 (more specifically, first conductive body 589a).

Through this, the ground of the first and second circuit boards 581, 582 and the second shield member 584 may be electrically connected to each other, respectively, thereby providing an effect of enlarging the ground and enhancing the reliability of electromagnetic wave shielding.

According to a mobile terminal associated with at least one embodiment of the present invention having the foregoing configuration, a lateral surface of the circuit board is used as a ground contact surface, thereby securing a higher reliability of the shield member. Furthermore, the contact of the ground is formed along the lateral surface, thereby further increasing the component mounting area of the circuit board.

In addition, in some implementations, a fastening protrusion is inserted to a recess portion of the circuit board, and accordingly, an assembly error between the shield member and the circuit board may be further reduced, thereby increasing the component mounting area of the circuit board.

Furthermore, in other implementations, a shield member is hooked to an edge portion of the circuit board, thereby increasing the component mounting area of the circuit board. Moreover, assembly and disassembly can be realized without using an additional clip device, and rework during the assembly of the circuit board and the shield member can be facilitated.

The configurations and methods according to the above-described embodiments will not be applicable in a limited way to the foregoing mobile terminal, and all or part of each embodiment may be selectively combined and configured to make various modifications thereto. It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A mobile terminal, comprising:
 a main body;
 at least one circuit board located in the main body, the at least one circuit board comprising an upper surface, a lower surface, and at least one lateral surface;
 at least one conductive body disposed at the at least one lateral surface of the at least one circuit board and electrically connected to a ground of the at least one circuit board; and
 at least one shield member mounted on the at least one circuit board and comprising:
  a base portion formed to cover at least part of the upper surface or the lower surface of the at least one circuit board;
  at least one protrusion portion protruding from the base portion and formed to be electrically in contact with the at least one conductive body; and
  a fastening protrusion protruded from the base portion and inserted into a recess portion formed at the upper surface or the lower surface of the at least one circuit board.

2. The mobile terminal of claim 1, wherein the at least one conductive body is formed along one direction at the at least one lateral surface of the at least one circuit board, and a plurality of the protrusion portions, including the at least one protrusion portion, are formed to be disposed at a predetermined interval along the one direction.

3. The mobile terminal of claim 2, wherein the at least one conductive body and the plurality of protrusion portions are formed to be brought into contact with each other.

4. The mobile terminal of claim 1, wherein the at least one shield member comprises a first shield member disposed at the upper surface of the at least one circuit board and a second shield member disposed at the lower surface of the at least one circuit board.

5. The mobile terminal of claim 4, wherein the first shield member and the second shield member have a first protrusion portion and a second protrusion portion, respectively, and the first and second protrusion portions are sequentially disposed with each other along the at least one lateral surface of the at least one circuit board.

6. The mobile terminal of claim 1, wherein the at least one shield member further comprises a hook portion bent at an end portion of the at least one protrusion portion to be hooked to an edge of the at least one circuit board.

7. The mobile terminal of claim 6, wherein the base portion of the at least one shield member comprises:
   a base surface formed in parallel with the upper surface or the lower surface of the at least one circuit board; and
   a protruded wing bent at the base surface to shield a gap formed between the base surface and the at least one circuit board, the at least one protrusion portion being disposed at an end portion of the protruded wing.

8. The mobile terminal of claim 7, wherein the at least one shield member further comprises a first shield member disposed at the upper surface of the at least one circuit board, a second shield member disposed at the lower surface of the at least one circuit board, and a recess portion recessed at an end portion of a first protruded wing of the first shield member to allow a second hook portion of the second shield member to be penetrated.

9. The mobile terminal of claim 7, wherein the at least one shield member further comprises a bending portion bent at the protruded wing in a direction parallel to the base surface of the at least one shield member, and a fastening hole is formed at the bending portion to fasten the at least one circuit board to the main body.

10. The mobile terminal of claim 1, wherein the at least one circuit board is formed to be laminated with a plurality of layers, and the recess portion is formed to penetrate part of the plurality of layers.

11. The mobile terminal of claim 10, wherein the plurality of layers comprises alternately layered insulating layers and printed layers, and one of the printed layers is disposed at the bottom of the recess portion.

12. The mobile terminal of claim 10, wherein any one of the plurality of layers forms the ground, and a connecting body having a conductive material is formed on the recess portion, and the connecting body is electrically connected to the ground.

13. The mobile terminal of claim 1, wherein the fastening protrusion is disposed in a direction perpendicular to the protrusion portion.

14. The mobile terminal of claim 1, wherein the at least one shield member comprises a first shield member disposed at the upper surface of the at least one circuit board, and a second shield member disposed at the lower surface of the at least one circuit board, wherein the first shield member and the second shield member have a first protrusion portion and a second protrusion portion, respectively, and the fastening protrusion is formed at either one of the first and second shield members, and wherein the first and second protrusion portions are sequentially disposed with each other along the at least one lateral surface of the at least one circuit board.

15. The mobile terminal of claim 1, wherein the at least one conductive body is disposed at both lateral surfaces of the at least one circuit board formed along one direction, and the at least one circuit board is formed to be extended along the one direction.

16. The mobile terminal of claim 1, wherein an antenna portion for transmitting and receiving radio signals is mounted on the main body, and wherein an earth connecting portion extended from an antenna pattern of the antenna portion toward the at least one lateral surface of the at least one circuit board to be brought into contact with the conductive body is formed on the antenna portion.

17. The mobile terminal of claim 1, wherein the at least one circuit board comprises a first circuit board and a second circuit board disposed with a first conductive body and a second conductive body, respectively, at a lateral surface thereof, and wherein an auxiliary protrusion portion protruded toward the second circuit board to be electrically connected to the second conductive body is formed at a first shield member mounted on the first circuit board.

18. A mobile terminal, comprising:
   a main body;
   at least one circuit board located in the main body and comprising an upper surface, a lower surface, and at least one lateral surface, the at least one circuit board formed by a plurality of layers including insulating layers and printed layers that are laminated;
   at least one conductive body disposed at the at least one lateral surface of the at least one circuit board and electrically connected to a ground of the at least one circuit board; and
   at least one shield member mounted on the at least one circuit board and comprising:
      a base portion formed to cover at least part of the upper surface or the lower surface of the at least one circuit board;
      at least one protrusion portion protruded from the base portion and formed to be electrically in contact with the conductive body; and
      a fastening protrusion protruding from the base portion and inserted into a recess portion formed at the upper surface or the lower surface of the at least one circuit board, wherein the recess portion is formed to penetrate part of the plurality of layers of the at least one circuit board.

19. The mobile terminal of claim 18, wherein the at least one shield member comprises a first shield member disposed at the upper surface of the at least one circuit board, and a second shield member disposed at the lower surface of the at least one circuit board, wherein the first shield member and the second shield member have a first protrusion portion and a second protrusion portion, respectively, and the fastening protrusion is formed at either one of the first and second shield members, and wherein the first and second protrusion portions are sequentially disposed with each other along the at least one lateral surface of the at least one circuit board.

* * * * *